(12) United States Patent
Prindle et al.

(10) Patent No.: US 8,673,759 B2
(45) Date of Patent: Mar. 18, 2014

(54) DRY ETCH POLYSILICON REMOVAL FOR REPLACEMENT GATES

(75) Inventors: Chris M. Prindle, Dresden (DE); Klaus Hempel, Dresden (DE); Andy C. Wei, Dresden (DE)

(73) Assignee: GlobalFoundries Inc., Grand Cayman (KY)

( * ) Notice: Subject to any disclaimer, the term of this patent is extended or adjusted under 35 U.S.C. 154(b) by 61 days.

(21) Appl. No.: 13/398,991

(22) Filed: Feb. 17, 2012

(65) Prior Publication Data

US 2013/0217221 A1   Aug. 22, 2013

(51) Int. Cl.
*H01L 21/28* (2006.01)

(52) U.S. Cl.
USPC ........... 438/595; 438/275; 438/278; 438/283; 257/E21.19

(58) Field of Classification Search
USPC .......................................... 438/275, 278, 283
See application file for complete search history.

(56) References Cited

U.S. PATENT DOCUMENTS

| | | |
|---|---|---|
| 8,084,346 B1 | 12/2011 | Guo et al. |
| 2005/0269644 A1 | 12/2005 | Brask et al. |
| 2008/0113480 A1 | 5/2008 | Nishida et al. |
| 2008/0265322 A1 | 10/2008 | Lin et al. |
| 2011/0073963 A1 | 3/2011 | Beyer et al. |

FOREIGN PATENT DOCUMENTS

DE   10 2009 047 891 A1   4/2011

OTHER PUBLICATIONS

Office Action for German Patent Application No. 10 2012 205 320.4, dated Sep. 28, 2012, pp. 1-3.

*Primary Examiner* — Alexander Ghyka
(74) *Attorney, Agent, or Firm* — Ditthavong Mori & Steiner, P.C.

(57) ABSTRACT

Semiconductor devices are formed with a gate last, high-K/metal gate process with complete removal of the polysilicon dummy gate and with a gap having a low aspect ratio for the metal fill. Embodiments include forming a dummy gate electrode on a substrate, the dummy gate electrode having a nitride cap, forming spacers adjacent opposite sides of the dummy gate electrode forming a gate trench therebetween, dry etching the nitride cap, tapering the gate trench top corners; performing a selective dry etch on a portion of the dummy gate electrode, and wet etching the remainder of the dummy gate electrode.

20 Claims, 5 Drawing Sheets

DRY ETCH POLYSILICON REMOVAL FOR REPLACEMENT GATES

TECHNICAL FIELD

The present disclosure relates to removal of dummy gates in gate last high-K/metal gate processes. The present disclosure is particularly applicable to 32 nanometer (nm) technology nodes, and beyond.

BACKGROUND

The integration of hundreds of millions of circuit elements, such as transistors, on a single integrated circuit necessitates further dramatic scaling down or micro-miniaturization of the physical dimensions of circuit elements, including interconnection structures. Micro-miniaturization has engendered a dramatic increase in transistor engineering complexity, such as the inclusion of lightly doped drain structures, multiple implants for source/drain regions, silicidation of gates and source/drains, and multiple sidewall spacers, for example.

The drive for high performance requires high speed operation of microelectronic components requiring high drive currents in addition to low leakage, i.e., low off-state current, to reduce power consumption. Typically, the structural and doping parameters tending to provide a desired increase in drive current adversely impact leakage current.

Metal gate electrodes have evolved for improving the drive current by reducing polysilicon depletion. However, simply replacing polysilicon gate electrodes with metal gate electrodes may engender issues in forming the metal gate electrode prior to high temperature annealing to activate the source/drain implants, as at a temperature in excess of 900° C. This fabrication technique may degrade the metal gate electrode or cause interaction with the gate dielectric, thereby adversely impacting transistor performance.

Replacement gate techniques have been developed to address problems attendant upon substituting metal gate electrodes for polysilicon gate electrodes. For example, a polysilicon dummy gate is used during initial processing until high temperature annealing to activate source/drain implants has been implemented. Subsequently, the polysilicon is removed and replaced with a metal gate.

Replacement gate techniques have conventionally employed a wet etch approach, for example using tetramethylammonium hydroxide (TMAH), to remove the polysilicon. However, wet etching the polysilicon has been found to be unreliable. TMAH is surface sensitive. Therefore, the replacement gate must be polished down to the polysilicon prior to etching the polysilicon with TMAH. If the polishing step leaves behind any residue, the TMAH will fail to completely remove the polysilicon. To achieve an effective polishing of the surface, the gate spacers must first be thinned laterally (a spacer shaper step), which may contaminate the polysilicon and interfere with the removal thereof. Further, the wet etch of the polysilicon forms a gap with vertical sidewalls and, thus, a high aspect ratio, which renders difficult the subsequent metal deposition and metal fill in the gap.

A need therefore exists for methodology enabling complete removal of the polysilicon dummy gate, eliminating the need for a spacer shaper step, and forming a gap having a low aspect ratio.

SUMMARY

An aspect of the present disclosure is a method including dummy gate removal by selective dry etching a nitride cap, tapering gate trench top corners, selective dry etching a portion of the dummy gate electrode, and wet etching the remainder of the dummy gate electrode.

Another aspect of the present disclosure is a method including dummy gate removal by selective dry etching a nitride cap, selective dry etching a portion of the dummy gate electrode while concurrently tapering gate trench top corners, and wet etching the remainder of the dummy gate electrode.

Additional aspects and other features of the present disclosure will be set forth in the description which follows and in part will be apparent to those having ordinary skill in the art upon examination of the following or may be learned from the practice of the present disclosure. The advantages of the present disclosure may be realized and obtained as particularly pointed out in the appended claims.)

According to the present disclosure, some technical effects may be achieved in part by a method including: forming a dummy gate electrode on a substrate, the dummy gate electrode having a nitride cap; forming spacers adjacent opposite sides of the dummy gate electrode, forming a gate trench therebetween; dry etching the nitride cap; tapering the gate trench top corners; performing a selective dry etch on a portion of the dummy gate electrode; and wet etching the remainder of the dummy gate electrode.

Aspects of the present disclosure include the dummy gate electrode including polysilicon. Further aspects include tapering the gate trench top corners by performing a non-selective dry etch on the polysilicon. Another aspect includes sputtering argon at an angle of 30° to 60° for the non-selective dry etch. Additional aspects include the selective dry etch being selective to oxide and nitride. Other aspects include the portion including 60% to 90% of the dummy gate electrode. Further aspects include wet etching with tetramethylammonium hydroxide (TMAH), ammonia, or ammonium hydroxide. Another aspect includes filling the gate trench with metal, subsequent to wet etching the remainder of the dummy gate electrode, to form a metal gate electrode. Other aspects include forming a high-K dielectric layer on the substrate prior to forming the dummy gate electrode. Additional aspects include forming a metal layer on the high-K dielectric layer prior to forming the dummy gate electrode.

Another aspect of the present disclosure is a method including forming a dummy gate electrode on a substrate, the dummy gate electrode having a nitride cap; forming spacers adjacent opposite sides of the dummy gate electrode, forming a gate trench therebetween; dry etching the nitride cap; performing a selective dry etch on a portion of the dummy gate electrode and concurrently tapering the gate trench top corners; and wet etching the remainder of the dummy gate electrode.

Aspects include the dummy gate electrode comprises polysilicon. Further aspects include tapering the gate trench top corners by sputtering argon at an angle of 30° to 60°. Additional aspects include the selective dry etch being selective to oxide and nitride. Other aspects include the portion including 60% to 90% of the dummy gate electrode. Further aspects include wet etching with tetramethylammonium hydroxide (TMAH), ammonia, or ammonium hydroxide. Another aspect includes filling the gate trench with metal, subsequent to wet etching the remainder of the dummy gate electrode, to form a metal gate electrode. Other aspects include forming a high-K dielectric layer on the substrate prior to forming the dummy gate electrode. Additional aspects include forming a metal layer on the high-K dielectric layer prior to forming the dummy gate electrode.

Another aspect of the present disclosure is a method including: forming high-K dielectric layers on a substrate;

forming a polysilicon gate electrode on each high-K dielectric layer; forming a nitride cap on each polysilicon gate electrode; forming spacers adjacent opposite sides of each polysilicon gate electrode, forming a gate trench therebetween; filling space between adjacent polysilicon gate electrodes with an oxide interlayer dielectric; dry etching the nitride caps with an etch chemistry that is selective to oxide; sputtering argon at an angle of 30° to 60° to taper the gate trench top corners; dry etching a portion of each dummy gate electrode with an etch chemistry that is selective to oxide and nitride; wet etching the remainder of each dummy gate electrode, forming respective cavities; and filling each cavity with a metal gate electrode.

Additional aspects and technical effects of the present disclosure will become readily apparent to those skilled in the art from the following detailed description wherein embodiments of the present disclosure are described simply by way of illustration of the best mode contemplated to carry out the present disclosure. As will be realized, the present disclosure is capable of other and different embodiments, and its several details are capable of modifications in various obvious respects, all without departing from the present disclosure. Accordingly, the drawings and description are to be regarded as illustrative in nature, and not as restrictive.

BRIEF DESCRIPTION OF THE DRAWINGS

The present disclosure is illustrated by way of example, and not by way of limitation, in the figures of the accompanying drawing and in which like reference numerals refer to similar elements and in which.

DETAILED DESCRIPTION

In the following description, for the purposes of explanation, numerous specific details are set forth in order to provide a thorough understanding of exemplary embodiments. It should be apparent, however, that exemplary embodiments may be practiced without these specific details or with an equivalent arrangement. In other instances, well-known structures and devices are shown in block diagram form in order to avoid unnecessarily obscuring exemplary embodiments. In addition, unless otherwise indicated, all numbers expressing quantities, ratios, and numerical properties of ingredients, reaction conditions, and so forth used in the specification and claims are to be understood as being modified in all instances by the term "about."

Figure 1:
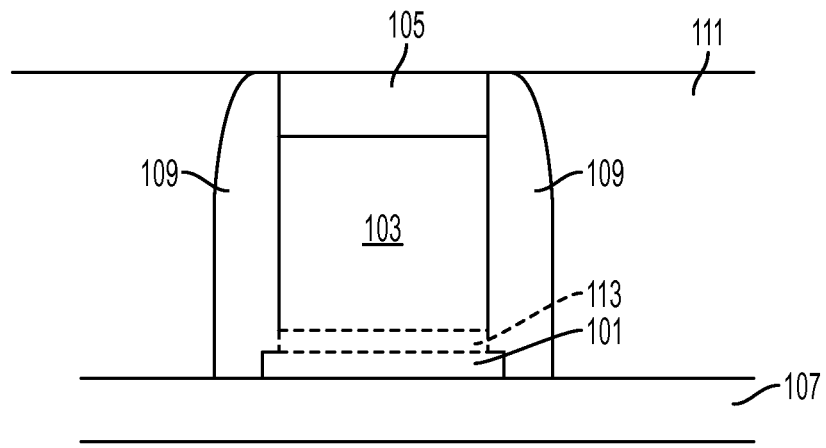
FIG. 1 schematically illustrates a conventional replacement gate structure.

Adverting to FIG. 1, a conventional replacement gate structure is illustrated. A high-K dielectric layer 101, polysilicon dummy gate 103, and nitride cap 105 (for example, silicon nitride) are sequentially formed on a silicon substrate 107. Spacers 109 are formed adjacent opposite sides of polysilicon dummy gate 103 forming a gate trench in which a metal electrode will later be formed, and space between adjacent gates is filled with an interlayer dielectric 111, such as silicon dioxide. A thin metal layer 113, such as titanium nitride (TiN), may optionally be formed between high-K dielectric layer 101 and polysilicon dummy gate 103. Alternatively, high-K dielectric layer 101 may be formed after removal of polysilicon dummy gate 103.

The present disclosure addresses and solves the current problems of incomplete polysilicon removal and subsequent metal gate fill difficulties attendant upon TMAH removal of polysilicon dummy gate 103 and replacement with a metal gate electrode. In accordance with embodiments of the present disclosure, a selective dry etch breaks through the nitride cap, a non-selective polysilicon dry etch tapers the corners of the gate trench, a selective dry etch removes a majority of the polysilicon, and a wet etch removes the remainder of the polysilicon.

Methodology in accordance with embodiments of the present disclosure includes: forming a dummy gate electrode on a substrate, for example of polysilicon, the dummy gate electrode having a nitride cap, forming spacers adjacent opposite sides of the dummy gate electrode which forms a gate trench therebetween, dry etching the nitride cap, tapering the gate trench top corners, performing a selective dry etch on a portion of the dummy gate electrode, and wet etching the remainder of the dummy gate electrode.

Still other aspects, features, and technical effects will be readily apparent to those skilled in this art from the following detailed description, wherein preferred embodiments are shown and described, simply by way of illustration of the best mode contemplated. The disclosure is capable of other and different embodiments, and its several details are capable of modifications in various obvious respects. Accordingly, the drawings and description are to be regarded as illustrative in nature, and not as restrictive.

FIGS. 2A through 2D schematically illustrate a process flow for removing the polysilicon dummy gate of FIG. 1 in a replacement gate process, in accordance with an exemplary embodiment. Adverting to FIG. 2A, after the dummy gate is polished, stopping on nitride cap 105, a dry etch is performed to remove nitride cap 105. The dry etch employs etch chemistries commonly used to etch silicon nitride, for example, a nitride reactive ion etch (RIE), and must be selective to oxide, to protect ILD 111.

Figure 2A:
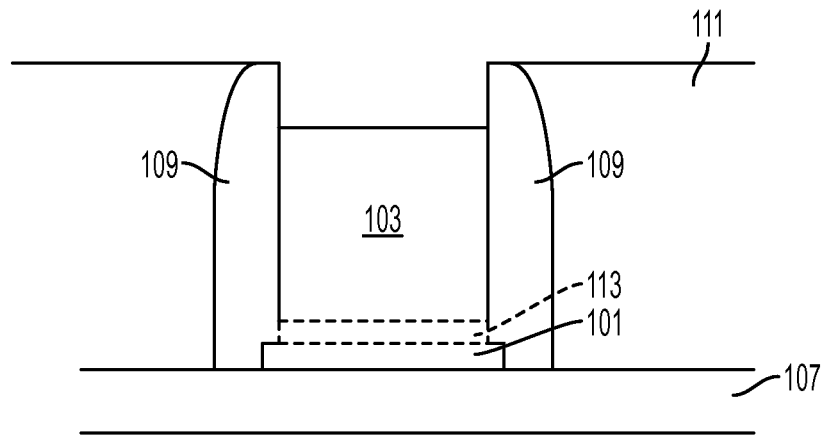
FIGS. 2A through 2D schematically illustrate a process flow for removing a polysilicon replacement gate, in accordance with an exemplary embodiment.
Figure 2B:
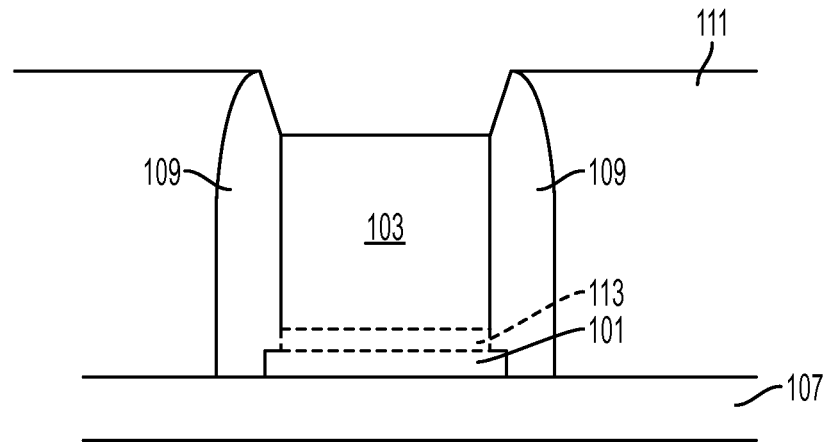

As illustrated in FIG. 2B, removal of the polysilicon begins with a non-selective etch, which removes a sufficient amount of polysilicon to taper the top corners of the gate trench. For example, argon may be sputtered at an angle of 30° to 60°, e.g. 45°. The resulting taper reduces the aspect ratio of the trench for subsequent metal fill.

Figure 2C:
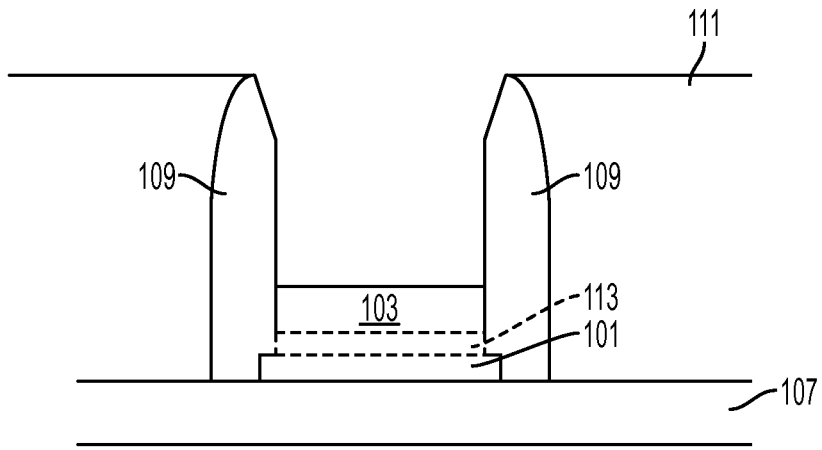

Next, a dry etch, selective to nitride and oxide, is performed to remove a majority of the polysilicon, for example 60% to 90%, e.g. 75%, as illustrated in FIG. 2C. The dry etch employs etch chemistries commonly used to etch polysilicon and is ceased before reaching the bottom of the gate, so as not to damage the underlying layers. A wet pass clean may be performed after the dry etch process is completed.

Figure 2D:
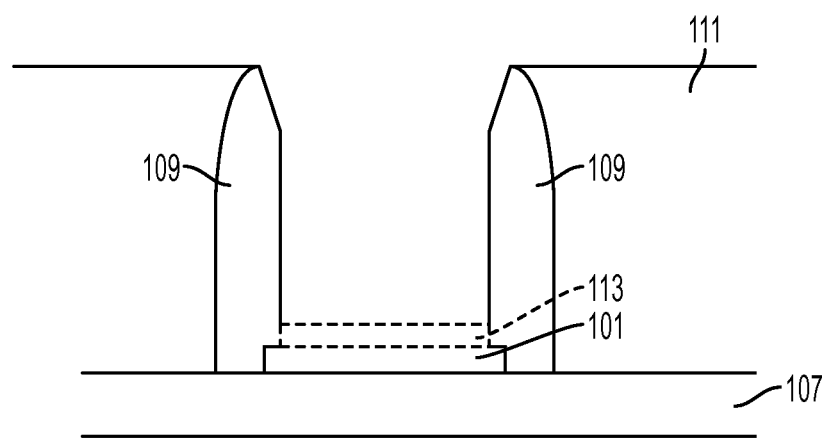

Adverting to FIG. 2D, the remainder of polysilicon dummy gate electrode 103 is removed by a wet etch process, for example using TMAH, ammonia, or ammonium hydroxide. Once the polysilicon is removed completely, the cavity formed may be filled with a metal gate. For example, a work function metal such as TiN may be deposited on the bottom and sidewalls of the cavity, followed by a metal fill with, for example, aluminum or tungsten, for the remainder of the cavity.

Figure 3A:
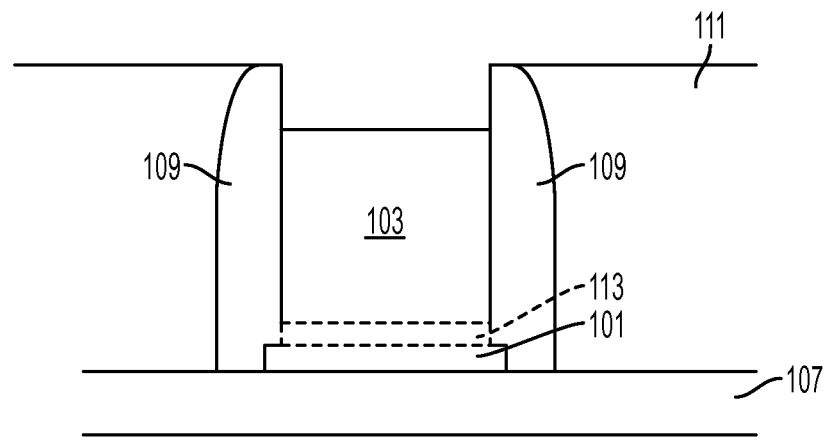
FIGS. 3A through 3C schematically illustrate a process flow for removing a polysilicon replacement gate, in accordance with another exemplary embodiment.
Figure 3B:
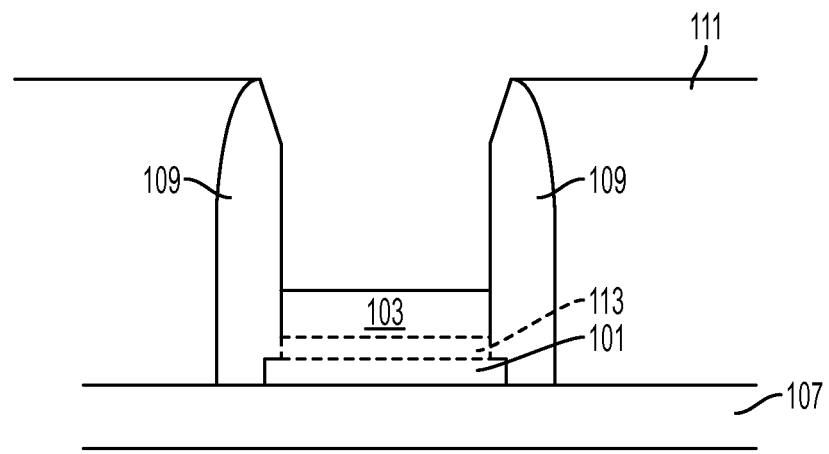
Figure 3C:
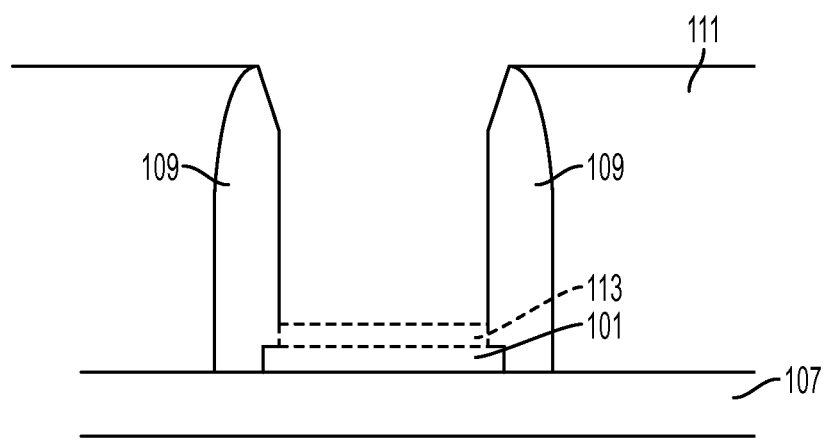

FIGS. 3A through 3C schematically illustrate a process flow for removing the polysilicon dummy gate of FIG. 1 in a replacement gate process, in accordance with another exemplary embodiment. In this embodiment, the non-selective polysilicon etch illustrated in FIG. 2B is skipped and incorporated into the subsequent dry etch process. Adverting to FIG. 3A, after the dummy gate is polished, stopping on nitride cap 105, a dry etch is performed to remove nitride cap 105, similar to the step shown in FIG. 2A. The dry etch employs etch chemistries commonly used to etch silicon nitride, for example, a nitride RIE, and must be selective to oxide, to protect ILD 111.

As illustrated in FIG. 3B, a dry etch, selective to nitride and oxide, is performed to remove a majority of the polysilicon, for example 60% to 90%. The dry etch employs etch chemistries commonly used to etch polysilicon and is ceased before reaching the bottom of the gate, so as not to damage the underlying layers. Concurrently with the dry etch, argon may be sputtered, for example at an angle of 30° to 60°, e.g. 45°, with a flow rate similar to that of the step shown in FIG. 2B, to taper the gate trench top corners. A wet pass clean may be performed after the dry etch process is completed.

The remainder of polysilicon gate electrode 103 is removed by a wet etch process, for example using TMAH, ammonia, or ammonium hydroxide, as illustrated in FIG. 3C. Once the polysilicon is removed completely, the cavity formed may be filled with a metal gate. For example, a work function metal such as titanium nitride (TiN) may be deposited on the bottom and sidewalls of the cavity, followed by a metal fill with, for example, aluminum or tungsten, for the remainder of the cavity.

The embodiments of the present disclosure can achieve several technical effects, including complete removal of the polysilicon dummy gate with no damage to underlying layers, elimination of the need for a spacer shaper step, and reduction in the aspect ratio of the gate trench, thereby facilitating subsequent metal fill of the gate trench. Devices formed in accordance with embodiments of the present disclosure enjoy utility in various industrial applications, e.g., microprocessors, smart phones, mobile phones, cellular handsets, set-top boxes, DVD recorders and players, automotive navigation, printers and peripherals, networking and telecom equipment, gaming systems, and digital cameras. The present disclosure therefore enjoys industrial applicability in any of various types of semiconductor devices.

In the preceding description, the present disclosure is described with reference to specifically exemplary embodiments thereof. It will, however, be evident that various modifications and changes may be made thereto without departing from the broader spirit and scope of the present disclosure, as set forth in the claims. The specification and drawings are, accordingly, to be regarded as illustrative and not as restrictive. It is understood that the present disclosure is capable of using various other combinations and embodiments and is capable of any changes or modifications within the scope of the inventive concept as expressed herein.

What is claimed is:

1. A method comprising:
    forming a dummy gate electrode on a substrate, the dummy gate electrode having a nitride cap;
    forming spacers adjacent opposite sides of the dummy gate electrode, forming a gate trench therebetween;
    dry etching the nitride cap;
    tapering the gate trench top corners, subsequent to dry etching the nitride cap;
    performing a selective dry etch on a portion of the dummy gate electrode, subsequent to tapering the gate trench top corners, the portion comprising a majority of the dummy gate electrode; and
    wet etching the remainder of the dummy gate electrode, to prevent damage to layers underlying the dummy gate electrode.

2. The method according to claim 1, wherein the dummy gate electrode comprises polysilicon.

3. The method according to claim 2, comprising tapering the gate trench top corners by performing a non-selective dry etch on the polysilicon.

4. The method according to claim 3, comprising sputtering argon at an angle of 30° to 60° for the non-selective dry etch.

5. The method according to claim 2, wherein the selective dry etch is selective to oxide and nitride.

6. The method according to claim 2, wherein the portion comprises 60% to 90% of the dummy gate electrode.

7. The method according to claim 2, comprising wet etching with tetramethylammonium hydroxide (TMAH), ammonia, or ammonium hydroxide.

8. The method according to claim 2, further comprising filling the gate trench with metal, subsequent to wet etching the remainder of the dummy gate electrode, to form a metal gate electrode.

9. The method according to claim 2, comprising forming a high-K dielectric layer on the substrate prior to forming the dummy gate electrode.

10. The method according to claim 9, further comprising forming a metal layer on the high-K dielectric layer prior to forming the dummy gate electrode.

11. A method comprising:
    forming a dummy gate electrode on a substrate, the dummy gate electrode having a nitride cap;
    forming spacers adjacent opposite sides of the dummy gate electrode, forming a gate trench therebetween;
    dry etching the nitride cap;
    performing a selective dry etch on a portion of the dummy gate electrode and concurrently tapering the gate trench top corners, subsequent to dry etching the nitride cap, the portion comprising a majority of the dummy gate electrode; and
    wet etching the remainder of the dummy gate electrode, to prevent damage to layers underlying the dummy gate electrode.

12. The method according to claim 11, wherein the dummy gate electrode comprises polysilicon.

13. The method according to claim 12, comprising tapering the gate trench top corners by sputtering argon at an angle of 30° to 60°.

14. The method according to claim 12, wherein the selective dry etch is selective to oxide and nitride.

15. The method according to claim 12, wherein the portion comprises 60% to 90% of the dummy gate electrode.

16. The method according to claim 12, comprising wet etching with tetramethylammonium hydroxide (TMAH), ammonia, or ammonium hydroxide.

17. The method according to claim 16, further comprising filling the gate trench with metal, subsequent to wet etching the remainder of the dummy gate electrode, to form a metal gate electrode.

18. The method according to claim 12, comprising forming a high-K dielectric layer on the substrate prior to forming the dummy gate electrode.

19. The method according to claim 18, further comprising forming a metal layer on the high-K dielectric layer prior to forming the dummy gate electrode.

20. A method comprising:
    forming high-K dielectric layers on a substrate;
    forming a polysilicon gate electrode on each high-K dielectric layer;
    forming a nitride cap on each polysilicon gate electrode;
    forming spacers adjacent opposite sides of each polysilicon gate electrode, forming a gate trench therebetween;

filling space between adjacent polysilicon gate electrodes with an oxide interlayer dielectric;
dry etching the nitride caps with an etch chemistry that is selective to oxide;
sputtering argon at an angle of 30° to 60° to taper the gate trench top corners;
dry etching a portion of each dummy gate electrode with an etch chemistry that is selective to oxide and nitride;
wet etching the remainder of each dummy gate electrode, forming respective cavities; and
filling each cavity with a metal gate electrode.

* * * * *